(12) United States Patent
Dey et al.

(10) Patent No.: US 11,381,203 B2
(45) Date of Patent: Jul. 5, 2022

(54) FLICKER NOISE ELIMINATION IN A DOUBLE BALANCED MIXER DC BIAS CIRCUIT

(71) Applicant: Analog Devices International Unlimited Company, County Limerick (IE)

(72) Inventors: Aritra Dey, Raleigh, NC (US); Tolga Pamir, Ottawa (CA); Mostafa Haroun, Nepean (CA)

(73) Assignee: Analog Devices International Unlimited Company, Limerick (IE)

( * ) Notice: Subject to any disclaimer, the term of this patent is extended or adjusted under 35 U.S.C. 154(b) by 19 days.

(21) Appl. No.: 17/085,372

(22) Filed: Oct. 30, 2020

(65) Prior Publication Data

US 2022/0045646 A1 Feb. 10, 2022

Related U.S. Application Data

(60) Provisional application No. 63/062,714, filed on Aug. 7, 2020.

(51) Int. Cl.
  *H03D 7/16* (2006.01)
  *H03D 7/14* (2006.01)
  (Continued)

(52) U.S. Cl.
  CPC ........... *H03D 7/1441* (2013.01); *G05F 3/262* (2013.01); *H03D 7/1458* (2013.01);
  (Continued)

(58) Field of Classification Search
  CPC .. H03D 7/1441; H03D 7/1458; H03D 7/1491; G05F 3/262; H03F 3/35183; H03H 11/0422; H04B 1/04
  See application file for complete search history.

(56) References Cited

U.S. PATENT DOCUMENTS

| 6,211,718 B1 | 4/2001 | Souetinov |
| 6,865,382 B2 | 3/2005 | Behzad |

(Continued)

FOREIGN PATENT DOCUMENTS

| CN | 102394566 A | 3/2012 |
| JP | 2005184141 A | 7/2005 |

(Continued)

*Primary Examiner* — Dinh T Le
(74) *Attorney, Agent, or Firm* — Knobbe, Martens, Olson & Bear, LLP

(57) ABSTRACT

A transmitter that reduces $3^{rd}$ order harmonic (HD3) and inter modulation distortion (IMD3) for a gm stage of a mixer while reducing flicker noise is disclosed. The transmitter may include a balanced mixer, a transconductance stage connected to the mixer, and a bias circuit. The bias circuit may include a programmable current source configured to provide a reference current. Further, the bias circuit may include a replica circuit configured to replicate a DC signal of the transconductance stage. The bias circuit may also include a bias transistor configured to level shift a bias signal obtained from a signal source based on the reference current and the DC signal of the transconductance stage as determined from the replica circuit.

20 Claims, 4 Drawing Sheets

(51) Int. Cl.
*H03H 11/04* (2006.01)
*H03F 3/45* (2006.01)
*H04B 1/04* (2006.01)
*G05F 3/26* (2006.01)

(52) U.S. Cl.
CPC ....... *H03D 7/1491* (2013.01); *H03F 3/45183* (2013.01); *H03H 11/0422* (2013.01); *H04B 1/04* (2013.01); *H04B 1/0475* (2013.01); H03D 2200/0033 (2013.01); H03D 2200/0043 (2013.01); H03D 2200/0047 (2013.01); H03D 2200/0052 (2013.01); H03D 2200/0054 (2013.01); H03D 2200/0078 (2013.01)

(56) References Cited

U.S. PATENT DOCUMENTS

| | | |
|---|---|---|
| 7,177,620 B1 | 2/2007 | Tsai et al. |
| 7,366,484 B2 | 4/2008 | Sowlati |
| 7,375,577 B2 | 5/2008 | Lin |
| 7,474,149 B2 | 1/2009 | Snelgrove et al. |
| 7,944,309 B2 | 5/2011 | Cao |
| 7,952,408 B2 | 5/2011 | Eisenstadt et al. |
| 7,962,116 B1 | 6/2011 | Tsai et al. |
| 8,045,943 B2 | 10/2011 | Kaczman et al. |
| 8,933,745 B2 | 1/2015 | Wu et al. |
| 9,292,716 B2 | 3/2016 | Winoto et al. |
| 9,654,108 B2 | 5/2017 | Siprak et al. |
| 2004/0038662 A1 | 2/2004 | Darabl |
| 2007/0200622 A1* | 8/2007 | Filoramo ............. H03D 7/1441 330/10 |
| 2011/0165854 A1* | 7/2011 | Lou ..................... H03D 7/1458 455/295 |

FOREIGN PATENT DOCUMENTS

| | | |
|---|---|---|
| JP | 5407542 B2 | 2/2014 |
| KR | 100456238 B1 | 11/2004 |

\* cited by examiner

FLICKER NOISE ELIMINATION IN A DOUBLE BALANCED MIXER DC BIAS CIRCUIT

INCORPORATION BY REFERENCE TO ANY PRIORITY APPLICATIONS

This application claims priority to U.S. Provisional Application No. 63/062,714, which was filed on Aug. 7, 2020 and is titled "FLICKER NOISE ELIMINATION IN A DOUBLE BALANCED MIXER DC BIAS CIRCUIT" the disclosure of which is expressly incorporated by reference herein in its entirety for all purposes. Any and all applications for which a foreign or domestic priority claim is identified in the Application Data Sheet as filed with the present application are hereby incorporated by reference under 37 CFR 1.57.

FIELD OF THE DISCLOSURE

Embodiments of the present disclosure relate to a balanced mixer and more specifically, to the elimination of flicker noise in a DC bias circuit of the balanced mixer.

BACKGROUND

Communication circuits often include a mixer element that mixes a carrier signal with a data signal. For example, the mixer element may mix a data signal with an oscillator signal. Further, wireless devices often support multiple communication frequencies. Moreover, a wireless device may support different functionality that uses different frequencies. For example, a wireless device may support cellular communication and geolocation positioning services, which may operate using different frequencies. In some cases, harmonics of a signal and/or intermodulation between signals may cause undesired distortion in a desired or supported signal.

SUMMARY

The systems, methods and devices of this disclosure each have several innovative aspects, no single one of which is solely responsible for the all of the desirable attributes disclosed herein. Details of one or more implementations of the subject matter described in this specification are set forth in the accompanying drawings and the description below.

Certain aspects of the present disclosure relate to a transmitter that reduces $3^{rd}$ order harmonic (HD3) and inter modulation distortion (IMD3) for a gm stage of a mixer while reducing flicker noise. The transmitter may include a mixer, a transconductance stage connected to the mixer, and a bias circuit. The bias circuit may include a programmable current source configured to provide a reference current; a replica circuit configured to replicate a DC signal of the transconductance stage; and a bias transistor configured to level shift a bias signal obtained from a signal source based on the reference current and the DC signal of the transconductance stage. The DC signal of the transconductance stage may be determined from the replica circuit.

The transmitter of the preceding paragraph can include any combination and/or sub-combination of the following features: where the transconductance stage comprises a pair of nFETs connected as a differential pair; where the transconductance stage comprises a pair of pFETs connected as a differential pair; where the mixer is a Gilbert cell mixer; where the mixer is a double balanced mixer; where the mixer is a single balanced mixer; where the transistor comprises a pFET; where the bias circuit comprises a second bias transistor configured to level shift a second bias signal; where a phase of the bias signal and the second bias signal is the same phase as the DC signal; where the bias signal is supplied to a first transistor of the transconductance stage and the second bias signal is supplied to a second transistor of the transconductance stage; where the transmitter further comprises a filter preceding the bias circuit, where the filter comprises a differential Sallen-Key filter; where the filter comprises a biquad filter; where the bias circuit further comprises a matched resistor pair, wherein a first resistor of the matched resistor pair is configured to provide the bias signal to a first transistor of the transconductance stage and a second resistor of the matched resistor pair is configured to provide the bias signal to a second transistor of the transconductance stage; where the transmitter further comprises an averaging circuit configured to average a first digital-to-analog converter (DAC) current and a second DAC current, wherein the averaged DAC current is supplied as an input to the transconductance stage; where the signal source comprises a current steering digital-to-analog converter (DAC); where the bias circuit maintains a DC operating point for the transconductance stage at a level that reduces or eliminate a value for the third order derivative of current ($gm_3$) across a temperature range; and where the bias circuit maintains a DC operating point for the transconductance stage at a level that reduces or eliminates a value for the third order derivative of current ($gm_3$) across process.

Additional aspects of the present disclosure relate to a wireless device. The wireless device may include an antenna configured to emit a transmission signal and a transmitter in communication with the antenna and configured to generate the transmission signal emission or transmission by the antenna. The transmitter may include a mixer; a transconductance stage connected to the mixer; and a bias circuit. The bias circuit may include: a programmable current source configured to provide a reference current; a replica circuit configured to replicate a DC signal of the transconductance stage; and a bias transistor configured to level shift a bias signal obtained from a signal source based on the reference current and the DC signal of the transconductance stage.

The transmitter of the preceding paragraph can include any combination and/or sub-combination of the following features: where the transconductance stage comprises a pair of nFETs (or pFETs) connected as a differential pair; where the mixer is a Gilbert cell mixer; where the mixer is a double balanced mixer; where the mixer is a single balanced mixer or a single balanced structure; where the transistor comprises a pFET (or an nFET); where the bias circuit comprises a second bias transistor configured to level shift a second bias signal; where a phase of the bias signal and the second bias signal is the same phase as the DC signal; where the bias signal is supplied to a first transistor of the transconductance stage and the second bias signal is supplied to a second transistor of the transconductance stage; where the wireless device further comprises a filter preceding the bias circuit; where the filter comprises a differential Sallen-Key filter; where the filter comprises a biquad filter; where the bias circuit further comprises a matched resistor pair, wherein a first resistor of the matched resistor pair is configured to provide the bias signal to a first transistor of the transconductance stage and a second resistor of the matched resistor pair is configured to provide the bias signal to a second transistor of the transconductance stage; where the wireless device further comprises an averaging circuit configured to average a first digital-to-analog converter (DAC) current and a second DAC current, wherein the averaged DAC current is supplied as an input to the transconductance stage; where the signal source comprises a current steering digital-to-analog converter (DAC); where the wireless device further comprises a digital-to-analog converter (DAC) current source configured to generate an analog signal based on a digital data signal, wherein the analog signal is input to the transmitter; where the bias circuit maintains a DC operating point for the transconductance stage at a level that reduces or eliminates a value for the third order derivative of current ($gm_3$) across a temperature range; and where the bias circuit maintains a DC operating point for the transconductance stage at a level that reduces or eliminates a value for the third order derivative of current ($gm_3$) across process.

Yet additional aspects of the present disclosure relate to a method of biasing in a transmitter. The method may include generating a reference current using a programmable current source. Further, the method may include replicating a DC signal of a transconductance stage using a replica circuit, the transconductance stage connected to a mixer. Moreover, the method may include obtaining a bias signal from a signal source; and level shifting the bias signal based on the reference current and the DC signal using a bias transistor.

BRIEF DESCRIPTION OF THE DRAWINGS

Throughout the drawings, reference numbers are re-used to indicate correspondence between referenced elements. The drawings are provided to illustrate embodiments of the subject matter described herein and not to limit the scope thereof.

DETAILED DESCRIPTION

Figure 1:
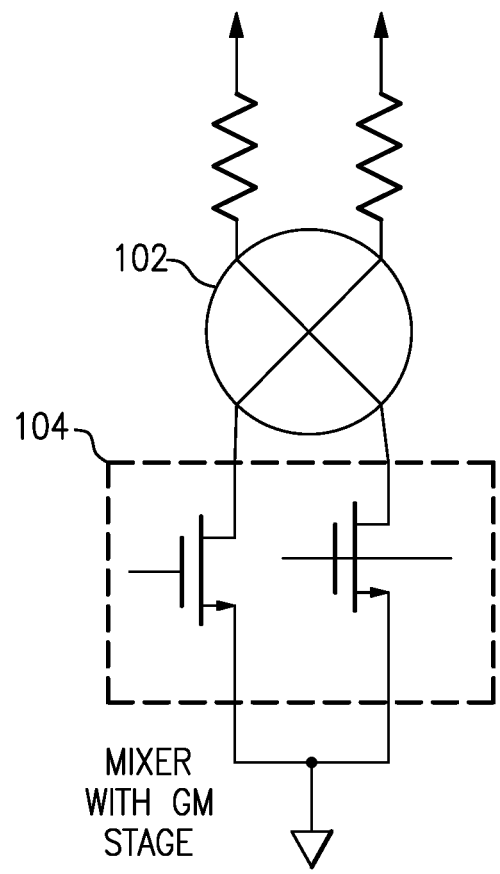
FIG. 1 illustrates a double balanced mixer with a corresponding transconductance (gm) stage.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A double balanced mixer used for up conversion in a transmitter may include a mixer with balanced differential inputs on both baseband and local oscillator (LO) ports. Further, although not limited as such, a double balanced mixer may have four diodes connected in a ring. Double balanced mixers are often used as part of RF front end circuits for both transmitters and receivers. For transmitters, the double balanced mixer may be used to up convert the baseband signal to the carrier frequency, and for receivers, the double balanced mixer may down convert the carrier frequency to the baseband signal. Since the mixer typically operates in a current mode, the mixer is often accompanied by a transconductance (henceforth referred to as "gm") stage that converts the incoming baseband voltage signal to a current signal.

Systems and methods of reducing $3^{rd}$ order harmonic (HD3) and inter modulation distortion (IMD3) for the gm stage of a double balanced mixer without the introduction of extra flicker noise is disclosed herein. Further, the present disclosure provides a direct current (DC) biasing scheme that biases the gm stage of the mixer that reduces or minimizes HD3 and IMD3 distortion without introducing any differential flicker noise.

As stated above, a double balanced mixer is often used in transmit architecture for converting baseband voltage signals to upconverted RF current signals. Along with the up converted baseband signal, the gm stage may generate distortion products, which can affect the RF output. As even order distortion products are common mode, a double balanced mixer effectively cancels them. However, the odd order distortion may be passed to the output. The $3^{rd}$ order distortion (HD3 and IMD3) may be the most prominent in the output signal. These HD3 and IMD3 distortions at the RF output can contribute to in band emissions and/or can degrade the EVM (error vector magnitude) of the transmitter that includes the double balanced mixer. Thus, it is generally desirable to eliminate or to reduce the $3^{rd}$ order distortion (both HD3 and IMD3) below a particular threshold level, which may vary based on a particular use-case. For example, in devices that support Long-Term Evolution (LTE) communication, the threshold level may be at or around 70 dBc. In devices that support Global System for Mobile Communications (GSM), the threshold level may be at or around 80 dBc. In addition to distortion, the gm stage may introduce flicker noise, which may also contribute to inband emission. Thus, it is desirable that the systems and methods used to reduce distortion do not introduce additional flicker noise into the circuit.

FIG. 1 illustrates a double balanced mixer 102 with a corresponding transconductance (gm) stage 104. The gm stage 104 may be used to convert a voltage to a current, which may be supplied to the mixer 102. The mixer 102 may perform an up conversion of a baseband current signal. The up conversion may be performed by mixing an oscillator signal (e.g., a carrier signal) with the baseband current signal, which may include data to be transmitted by a transmitter. The transistors of the gm stage 104 may have a degree of non-linearity, even when the transistors operate in the linear region. This non-linearity can cause distortion. Analysis of the gm stage 104 reveals that the HD3 and IMD3 distortion is mainly caused by the magnitude of the $3^{rd}$ order derivative of the biasing current (henceforth referred as $gm_3$) with respect to the bias voltage.

Figure 2:
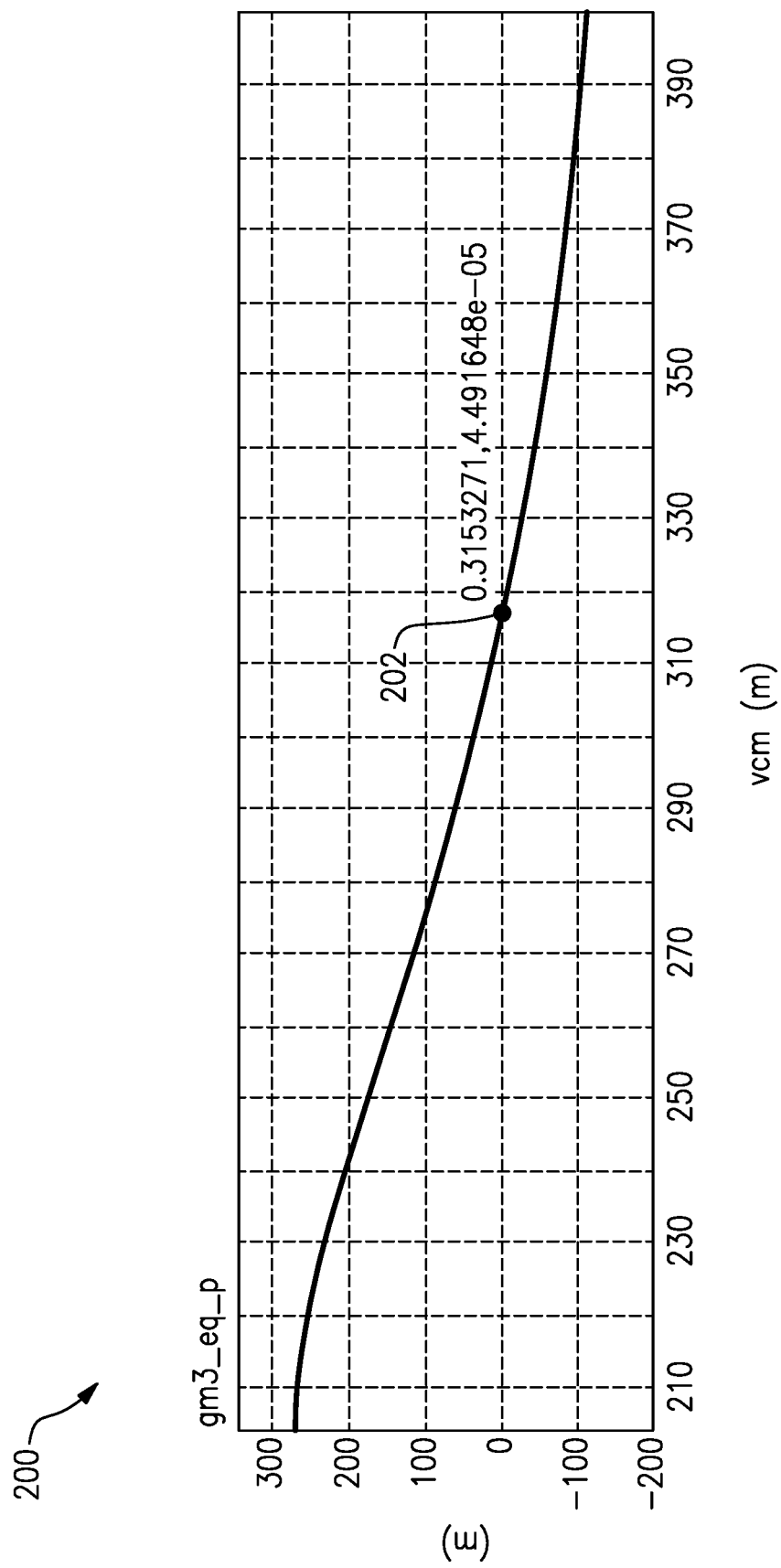
FIG. 2 presents a graph of the third order derivative of current ($gm_3$) with respect to bias voltage illustrating the point where $gm_3$ crosses zero.

FIG. 2 presents a graph 200 of the third order derivative of current ($gm_3$) with respect to bias voltage illustrating the point where $gm_3$ crosses zero (minima). The x-axis represents the common mode voltage, or the DC voltage at which the transistors of the gm stage 104 are biased, and the y-axis represents the $gm_3$, which may correspond to the third order coefficient of the nonlinear characteristics of the gm stage. The graph of FIG. 2 illustrates that there exists a bias where $gm_3$ reaches a minima (the zero point) as illustrated by point 202. In the example of FIG. 2, the $gm_3$ bias is 0.3V at a point where the third order derivative is 0. Thus, there is a need for a common mode biasing circuit that will bias the gm stage at a particular bias current so as to render $gm_3=0$ and hence, minimize HD3 and IMD3. Furthermore, it is desirable that the bias point be chosen such that the magnitude of $gm_3$ remains minimal across different process and temperature points. Not only is it desirable to minimize HD3 and IMD3, but it is also desirable to maintain a constant current to help maintain $gm_3$ at a minimal value across process. Process may refer to the manufacture of silicon or an integrated circuit product (e.g., a transmitter). As the silicon process changes, particular parameters may change resulting in changes in $gm_3$. By maintaining constant current, it is possible to keep $gm_3$ at or near zero, or at a sufficiently low level to maintain or reduce $3^{rd}$ order distortion to −70 dBc. Moreover, it is desirable that the current be constant across different process and temperature points. Further, it is desirable that the circuit be programmable. Embodiments of the present disclosure achieve the aforementioned goals.

Figure 3:
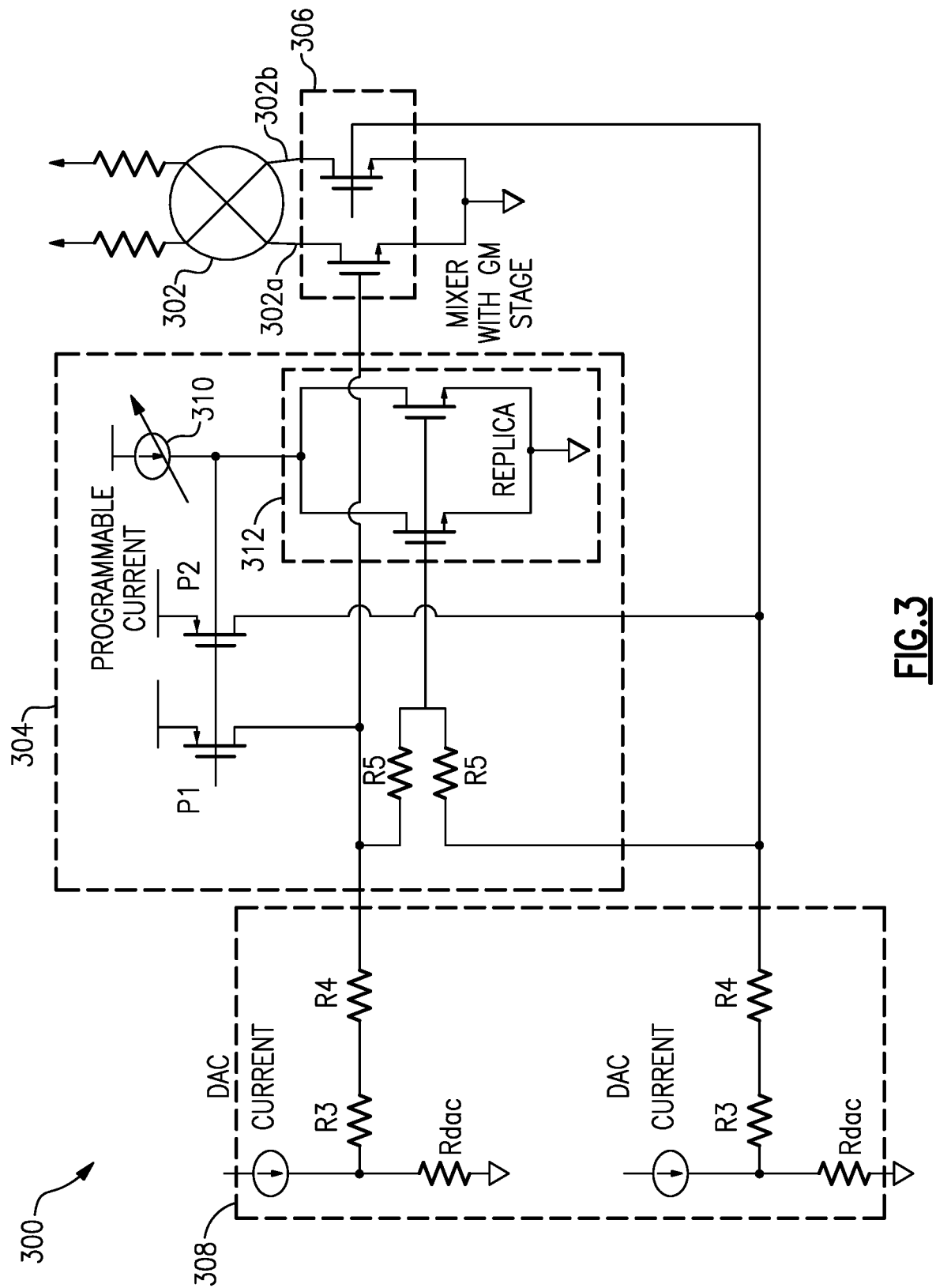
FIG. 3 illustrates a non-limiting example of a zero-intermediate frequency (ZIF) transmitter (Tx) path with a common mode biasing scheme to level shift the common mode between a digital-to-analog converter (DAC) output and a gm stage input.

FIG. 3 illustrates a non-limiting example of a zero intermediate frequency (ZIF) transmitter (Tx) path with a common mode biasing scheme to level shift the common mode between a digital-to-analog converter (DAC) output and a gm stage input. The circuit 300 of FIG. 3 illustrates a double balanced mixer 302 and a biasing circuit 304 that includes a gm stage 306. The circuit 300 illustrates a common mode biasing scheme. The circuit 300 may be referred to as common mode because the bias is applied equally to each of the differential legs 302a and 302b of the mixer.

Constant current biasing may be used to maintain a minimal $gm_3$ across process. The gm stage 306 of the circuit 300 may be preceded by a 2nd order biquad filter 308 and a digital-to-analog converter (DAC) that may provide an input DAC current to the filter 308 and/or biasing circuit 304. In some cases, the filter 308 may be included as part of the biasing circuit 304. Further, maximizing the DAC headroom can be used to minimize distortion due to compression at the DAC output. In certain embodiments, maximizing the DAC headroom prevents the common mode voltage at the DAC output from going above a particular voltage level such that the maximum signal swing present at the transistors of the DAC do not enter a triode mode that may cause signal distortion. Because the voltage levels to minimize $gm_3$ and to maximize DAC headroom may not be the same, it is desirable to create a common mode voltage shift between the DAC and the gm stage. The common mode biasing structure can achieve the common mode voltage shift by sourcing current through transistors P1 and P2, which can achieve the required level shifting through resistors R3 and R4. The transistors P1 and P2 may be pFET transistors. Alternatively, the transistors P1 and P2 may be implemented as nFETs that are in parallel with the Rdac resistors. Further, the current may be sourced from a programmable current source 310. The current may be referenced to a programmable current source 310 that is invariant over process and temperature. Thus, the bias circuit 304 can maintain a DC operating point for the gm stage 306 at a point that maintains the $gm_3$ at 0 or within a threshold variance that achieves the desired distortion minimization (e.g., −70 or −80 dBc) across process and temperature while reducing the third harmonic distortion of the signal to be transmitted. The bias circuit 304 can maintain the DC operating point for the gm stage 306 at the point that maintains the $gm_3$ at 0 within a particular temperature range. This particular temperature range is typically −40 to 110 C. However, other temperature ranges are possible.

It is desirable to determine a voltage shift that minimizes $gm_3$ without affecting the signal current (as opposed to the DC biasing current) of the gm stage. In other words, as the gm stage is receiving the signal for transmission, it is desirable to maintain the integrity of the transmit signal and to not take actions that may alter the signal. Accordingly, to analyze or measure the signal at the gm stage without modifying the signal, the circuit 300 can replicate the gm stage with the gm stage replica circuit 312 enabling the circuit 300 to compare current in the gm stage replica circuit 312 with respect to a reference current, and to modify the level shifting voltage to maintain a fixed current in the replica circuit 312 without affecting the gm stage 306. Since by virtue of design the replica circuit 312 is an exact copy of the gm stage 306, the gm stage 306 can maintain the same constant current that helps to maintain $gm_3=0$ across process. Further, the common mode signal current generated by the replica circuit 312 is the same as that generated by the gm stage 306. As stated above, the reference current may be obtained from the programmable current source 310. The current sinked by the replica gm stage 312 that is compared to the reference current may be obtained from the biasing voltage that is generated from the current that flows through resistors R3 and R4, which is obtained from the DAC current sources and P3.

Although the circuit 300 can reduce HD3 and IMD3 distortion, the circuit 300 may, in some cases, inject flicker noise from the pMOS current sources P1 and P2. As the flicker noise from P1 and P2 may be statistically independent, the differential noise, in some cases, will be a sum of the flicker noise of both P1 and P2. Flicker noise is a low frequency noise that can be generated by a MOSFET device. It is sometimes referred to as 1/f noise or pink noise. Flicker noise in a zero-intermediate frequency (ZIF) transmitter (TX) creates undesired in-band emissions, and minimizing this noise is a major challenge for cellular transceivers. With the present design illustrated by circuit 300, it is desirable to reduce flicker noise from P1 and P2 to 0 to meet the in band emission requirements of 5G single band Time Division Duplexing (TDD) application.

Figure 4:
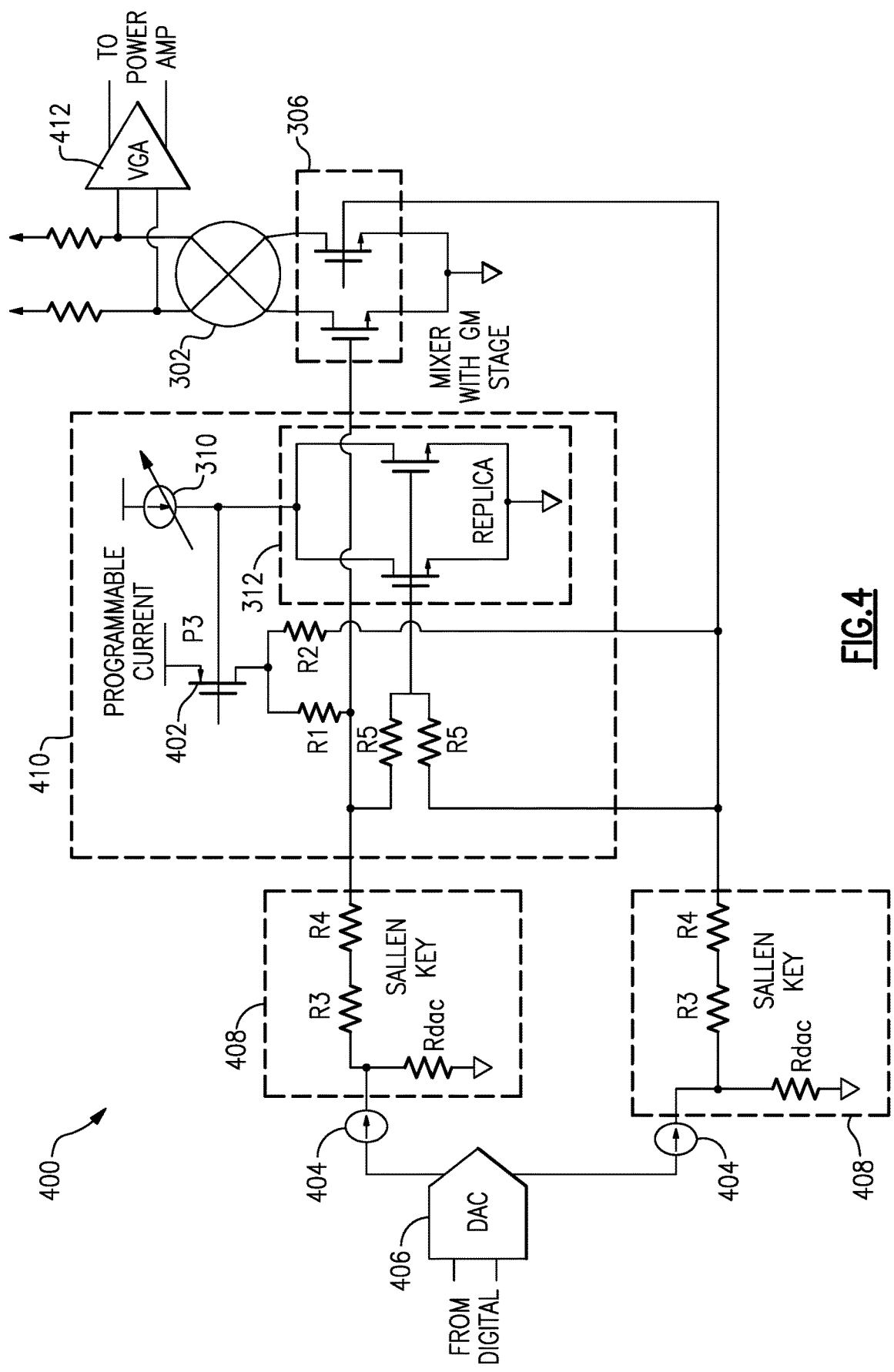
FIG. 4 illustrates a non-limiting example of a ZIF Tx path with reduced differential flicker noise in the common mode biasing scheme.

The present disclosure includes system and methods for ensuring that flicker noise from the TX baseband path bias circuits is common mode, and hence, not converted to RF by the TX mixer 302. FIG. 4 illustrates a non-limiting example of a ZIF Tx path with reduced differential flicker noise in the common mode biasing scheme. The circuit 400 of FIG. 4 replaces the current source structure of the circuit 300 (e.g., P1 and P2) in the bias circuit 304 with a single pMOS source P3 in the bias circuit 410 that is connected in common with the gm stage 306 and hence, does not generate any differential flicker noise. In other words, although the transistor P3 may produce flicker noise, because the gm stage 306 is a differential structure, the flicker noise is a common mode noise that is cancelled by the mixer 302. Generally, no common mode signal can pass through a perfectly balanced mixer. By using the single transistor 402, the biasing to both gm stage transistors is identical, and therefore the flicker noise is cancelled. Accordingly, the circuit 400 can both minimize HD3 and IMD3 distortion and reduce or eliminate flicker noise. Further, as with the bias circuit 304, the bias circuit 410 can maintain a DC operating point for the gm stage 306 at a point that maintains the $gm_3$ at or near 0, or at a point that maintains third harmonic distortion of the signal to be transmitted at or below −70 dBc across process and temperature.

Further, the circuit 400 includes additional resistor pair R1 and R2. In cases where the two resistors R1 and R2 do not introduce any flicker noise or produce a below threshold amount of flicker noise, the entire circuit contributes a reduced level of differential flicker noise. In some cases, the entire circuit contributes differential flicker noise much below the emission standards of LTE. For example, the differential flicker noise of the circuit 400 may be at or below −15 dBm/MHz. The resistors R1 and R2 can be configured to produce no flicker noise or less than a threshold amount of flicker noise by sizing the resistors appropriately. Typically, resistors with big width and length are used to reduce flicker and improve matching. For example, in some non-limiting embodiments, the resistors R1 and R2 may be selected to be at least 3 times the size of the resistors R3 and R4. It should be understood that other resistor sizes may be used in the context of the present disclosure. Generally, R1 and R2 are identical in value. Further, the resistors R1 and R2 may be carefully selected to be matched accounting for any differences in layout, location, and physical design to ensure that the current flowing through R1 and R2 is the same, thereby enabling the flicker noise to be cancelled by the balanced mixer stage 302. R1 and R2 may be matched by adjusting the sizing or length of the resistors, the layout, or other characteristics of the resistors. Moreover, as R1 and R2 are selected to be much larger than the filter resistors R3 and R4, any thermal noise contributed will have minimal impact. For example, the resistors R1 and R2 may be around 10 times the size of the resistors R3 and R4.

The common mode biasing circuit 400 may use the filter resistors Rdac, R3, and R4 to generate biasing voltages for the gm stage 306, along with the DAC current. The DAC current sources 404 may provide the signal to be transmitted along with a DC common mode value. The signal may be superimposed on a particular DC common mode current. For example, the signal may be centered around a mid-rail current. The two DAC current sources 404 may provide the same signal, but of opposite phase. The signal generated from the DAC 406 may be a differential signal that rides on top of, or is amplitude shifted by, a DC common mode signal. This DC signal is a part of the bias signal along with the DC common mode signal that is generated by embodiments of the circuit described herein.

Rdac, R3, and R4 may form a part of the filter 308 applied to the input signal. This filter 308 may be composed of two filters 408 that may have similar or the same configurations. Although these filters 408 may be separate from the biasing circuit 410, it can form a part of or function in conjunction with the biasing circuit 410. In other words, the DAC current and resistors R3 and R4 may generate a bias signal that can be supplied to the gm stage 306. However, it is desirable that the bias be at a point where $gm_3$ is equal to zero. The additional circuitry including the programmable current source 310, the transistor P3 (or the transistors P1 and P2 in the circuit 300), the replica circuit 312, and the resistors R1 and R2 may form an additional bias circuit that may be used to adjust the bias supplied to the gm stage 306 to remove the $gm_3$ nonlinearity such that that $gm_3$ is zero.

The programmable current source 310 may be programmed to account for the $gm_3$ value. As it is not known exactly what bias value will give $gm_3=0$ when the transmit circuit that includes the mixer 302 and gm stage 306 is manufactured, a programmable current source may be used so that the bias circuit 410 can be fine-tuned to provide an appropriate level of bias current so that $gm_3$ is zero. Thus, when the transmit circuit is designed and/or manufactured, the transmit circuit can be tested to determine the bias current applied to the gm stage that obtains a $gm_3$ equal to 0. Once this bias current is determined, the programmable current source 310 can be programmed to provide a current that in conjunction with the DAC current satisfies the determined bias current.

To further facilitate the search for the $gm_3=0$ point, the circuit may include a programmable current source 310 that maintains a programmable multiple of the reference current in the replica circuit 312. The programmable current source 310 can be tweaked for the optimal operating point since the exact bias current for $gm_3=0$ is not known a priori and can depend on several factors including layout parasitics. Although not limited as such, in certain implementations, the filters 408 may be implemented using a Sallen key implementation or design. However, standalone resistors can also be used.

The circuits 300 and 400 are common mode circuits. The common mode signal can be obtained by averaging the differential signal from two DAC currents. The resistors R5 in the circuit 300 and 400 enable the DAC currents to be averaged to obtain the common mode signal that is supplied to the gm stage. A DAC common mode current is obtained from the DAC current sources and a common mode current is generated by the circuit 300 and 400. Averaging the differential signal causes the differential signal to go to zero leaving behind the desired common mode signal.

The circuits 300 and 400 are non-limiting examples of circuits for generating the bias voltage that reduces the distortion attributable to $gm_3$. Other embodiments are possible. For example, the manner in which the level shifting voltage is generated (e.g., the difference between the input common mode from the DAC and the desired biasing voltage) can differ. For instance, the current from P3 (or P1 and P2 in the circuit 300) can flow through a different set of resistor combinations. As another example, the loop using the reference current and replica circuit may be arranged in a different manner, or the replica circuit may be eliminated by directly using the gm stage. Similarly the gm stage may not be preceded by a DAC and instead, could be preceded by some other circuit that may or may not provide a common mode current and thus, the present common mode circuit may need to provide all of the biasing voltage.

The output of the mixer 302 may be fed to a variable gain amplifier (VGA) 412. The output of the VGA 412 may be provided to a power amplifier or power amplifier module that includes one or more power amplifiers. The input to the circuit 400 may be an analog signal generated by the DAC 406 in response to a differential digital input. Moreover, the input signal to the circuit 300 or 400 may be a low frequency baseband signal. This low frequency baseband signal is typically <500 MHz for LTE and for many mm wave applications. As such, AC coupling capacitors may not be used in the signal path leading up to gm stage, which may block the low-frequency baseband signal used by a transmitter. However, in certain embodiments, other filter designs are possible.

Further, as previously mentioned, the circuits 300 and/or 400 may be part of a transmitter path. This transmitter path may be implemented, at least in part, in a front-end module (FEM), which may communicate with an antenna switch module and/or an antenna. For example, the power amplifier that received the output of the VGA 412 may be part of an FEM that is in communication with an antenna of a wireless device. This antenna may be configured to emit a transmission signal of the wireless device.

Terminology and Conclusion

The foregoing description may refer to elements or features as being "connected" or "coupled" together. As used herein, unless expressly stated otherwise, "connected"

means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may, perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A transmitter comprising:
    a mixer;
    a transconductance stage connected to the mixer; and
    a bias circuit connected to the transconductance stage, the bias circuit comprising:
        a programmable current source configured to provide a reference current;
        a replica circuit connected between the programmable current source and the transconductance stage, the replica circuit configured to replicate a DC bias of the transconductance stage; and
        a bias transistor connected to the replica circuit and the transconductance stage, the bias transistor configured to level shift a bias signal obtained from a signal source based on the reference current and the DC bias of the transconductance stage.

2. The transmitter of claim 1, wherein the transconductance stage comprises a pair of nFETs connected as a differential pair.

3. The transmitter of claim 1, wherein the mixer is a double balanced mixer or a Gilbert cell mixer.

4. The transmitter of claim 1, wherein the bias circuit comprises a second bias transistor configured to level shift a second bias signal.

5. The transmitter of claim 4, wherein a phase of the bias signal and a phase of the second bias signal are the same phase as the DC bias.

6. The transmitter of claim 4, wherein the bias signal is supplied to a first transistor of the transconductance stage and the second bias signal is supplied to a second transistor of the transconductance stage.

7. The transmitter of claim 1, further comprising a filter preceding the bias circuit.

8. The transmitter of claim 7, wherein the filter comprises a differential Sallen-Key filter.

9. The transmitter of claim 1, wherein the bias circuit further comprises a matched resistor pair, wherein a first resistor of the matched resistor pair is configured to provide the bias signal to a first transistor of the transconductance stage and a second resistor of the matched resistor pair is configured to provide the bias signal to a second transistor of the transconductance stage.

10. The transmitter of claim 1, further comprising an averaging circuit configured to average a first digital-to-analog converter (DAC) current and a second DAC current to obtain an averaged DAC current, wherein the averaged DAC current is supplied as an input to the transconductance stage.

11. The transmitter of claim 1, wherein the signal source comprises a digital-to-analog converter (DAC) current source.

12. The transmitter of claim 1, wherein the bias circuit maintains a DC operating point for the transconductance stage at a level that maintains a third order derivative of current ($gm_3$) across a temperature range.

13. A wireless device comprising:
    an antenna configured to emit a transmission signal; and a transmitter in communication with the antenna, the transmitter comprising:
a mixer;
a transconductance stage connected to the mixer; and
a bias circuit connected to the transconductance stage, the bias circuit comprising:
a programmable current source configured to provide a reference current;
a replica circuit connected between the programmable current source and the transconductance stage, the replica circuit configured to replicate a DC signal of the transconductance stage; and
a bias transistor connected to the replica circuit and the transconductance stage, the bias transistor configured to level shift a bias signal obtained from a signal source based on the reference current and the DC signal of the transconductance stage.

14. The wireless device of claim 13, wherein the bias circuit comprises a second bias transistor configured to level shift a second bias signal.

15. The wireless device of claim 14, wherein a phase of the bias signal and the second bias signal is the same phase as the DC signal.

16. The wireless device of claim 14, wherein the bias signal is supplied to a first transistor of the transconductance stage and the second bias signal is supplied to a second transistor of the transconductance stage.

17. The wireless device of claim 13, further comprising a Sallen-Key filter preceding the bias circuit.

18. The wireless device of claim 13, wherein the bias circuit further comprises a matched resistor pair, wherein a first resistor of the matched resistor pair is configured to provide the bias signal to a first transistor of the transconductance stage and a second resistor of the matched resistor pair is configured to provide the bias signal to a second transistor of the transconductance stage.

19. The wireless device of claim 13, further comprising an averaging circuit configured to average a first digital-to-analog converter (DAC) current and a second DAC current to obtain an averaged DAC current, wherein the averaged DAC current is supplied as an input to the transconductance stage.

20. A method of biasing in a transmitter, the method comprising:
generating a reference current using a programmable current source;
replicating a DC signal of a transconductance stage using a replica circuit connected between the programmable current source and the transconductance stage, the transconductance stage connected to a mixer;
obtaining a bias signal from a signal source; and
level shifting the bias signal based on the reference current and the DC signal using a bias transistor connected to the replica circuit and the transconductance stage.

* * * * *